United States Patent [19]

Mizutani et al.

[11] Patent Number: 4,954,871
[45] Date of Patent: Sep. 4, 1990

[54] SEMICONDUCTOR DEVICE WITH COMPOSITE ELECTRODE

[76] Inventors: Yoshihisa Mizutani, 2-11-23, Minamikugahara, Oota-ku, Tokyo; Minoru Kimura, 666-4, Komaoka-cho, Tsurumi-ku, Yokohama-shi, both of Japan

[21] Appl. No.: 147,107

[22] Filed: Jan. 21, 1988

Related U.S. Application Data

[63] Continuation of Ser. No. 778,777, Sep. 24, 1985, abandoned, which is a continuation of Ser. No. 390,030, Jun. 18, 1982, abandoned.

[30] Foreign Application Priority Data

Jun. 26, 1981 [JP] Japan .................................. 56-99357

[51] Int. Cl.$^5$ ........................................... H01L 23/48
[52] U.S. Cl. ........................................ 357/67; 357/42; 357/65; 357/68; 357/71; 357/59
[58] Field of Search ............... 357/42, 61, 67, 65, 357/67 S, 59 I, 59 J, 71, 71 S, 68

[56] References Cited

U.S. PATENT DOCUMENTS

| | | | |
|---|---|---|---|
| 3,617,824 | 11/1971 | Shinoda et al. | 357/875 |
| 3,736,478 | 5/1973 | Veloric | 357/675 X |
| 4,033,797 | 7/1977 | Dill et al. | 357/42 X |
| 4,333,099 | 6/1982 | Tanguay et al. | 357/67 |
| 4,343,082 | 8/1982 | Lepselter et al. | 357/67 S |
| 4,395,726 | 7/1983 | Maeguchi | 357/42 |
| 4,425,700 | 1/1984 | Sasaki et al. | 357/67 S |
| 4,447,823 | 5/1984 | Maeguchi et al. | 357/42 X |
| 4,450,470 | 5/1984 | Shiba | 357/59 |
| 4,488,166 | 12/1984 | Lehrer | 357/71 |

FOREIGN PATENT DOCUMENTS 2906249 8/1979 Fed. Rep. of Germany.
0015550 6/1975 Japan .................................. 357/67 S

OTHER PUBLICATIONS

Murarka, "Refractory Silicides for Integrated Circuits," *J. Vac. Sci. Technol.*, 17(4), Jul./Aug. 1980, pp. 775–779.
Kircher et al., "Interconnection Method for Integrated Circuits," *IBM Technical Disclosure Bulletin*, vol. 13, No. 2, Jul. 1970, p. 436.
Chow et al., "Refractory $MoSi_2$ and $MoSi_2$/Polysilicon Bulk CMOS Circuits," *IEEE Electron Device Letters*, vol. EDL-3, Feb. 1982, pp. 37–40.
Okada et al, "A New Polysilicon Process . . . ", 4/4/74, PSA Tech. IEEE Transactions, vol. ED-26, No. 4.
Sinka et al., "MOS Compatibility . . . ", Aug. 1980, IEEE Journal Solid-State Circuits, vol. SC-15.
Sasaki et al., "Application of $MoSi_2$. . . ", Aug. 1980, IEEE Trans. Elec. Dev., vol. ED-27, No. 8.
Geipel, Jr., et al. "Composite Silicide . . . ", Aug. 1980, IEEE Trans. Elec. Dev., vol. ED-27, No. 8.

*Primary Examiner*—Rolf Hille
*Assistant Examiner*—William Mintel

[57] ABSTRACT

Provided is a semiconductor device having a single continuous wiring layer in which a predetermined portion thereof is made of a semiconductor material, and the remaining portion thereof is made of a metal compound of the semiconductor material. The predetermined portion of the wiring layer preferably constitutes the gate electrode of a field effect transistor.

7 Claims, 4 Drawing Sheets

FIG. 1(E₁)  FIG. 1(E₂)
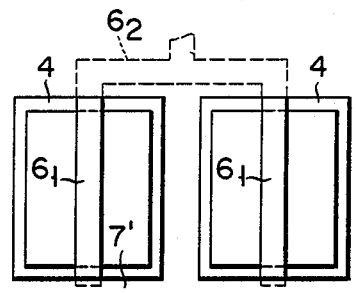 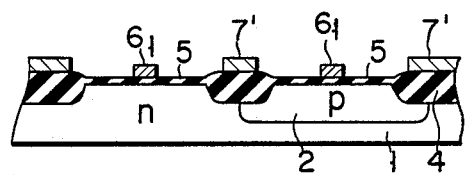
FIG. 1(F₁)  FIG. 1(F₂)
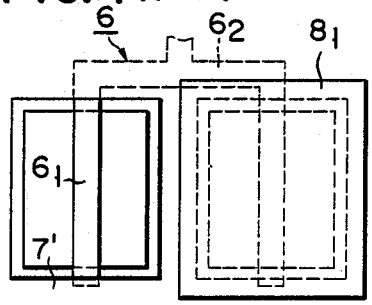 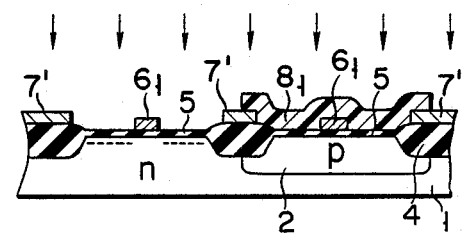
FIG. 1(G₁)  FIG. 1(G₂)
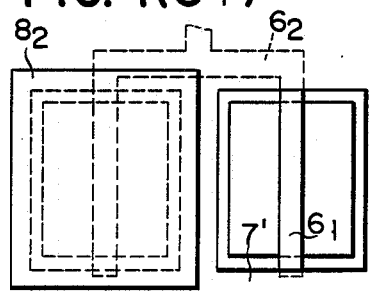 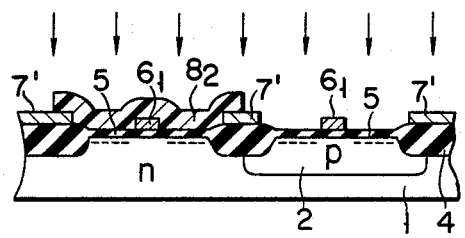
FIG. 1(H₁)  FIG. 1(H₂)
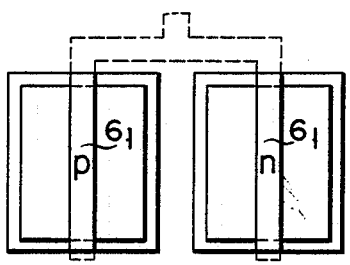 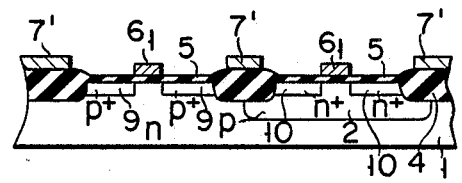

FIG. 1(I₁)  FIG. 1(I₂)
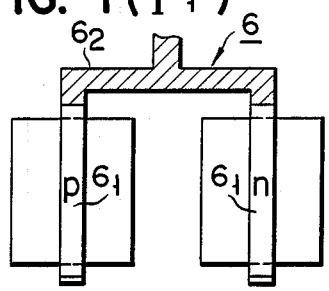 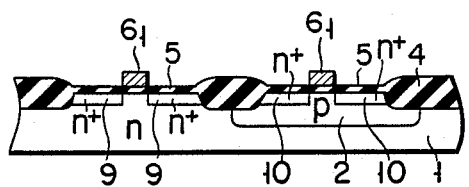
FIG. 1(J₁)  FIG. 1(J₂)
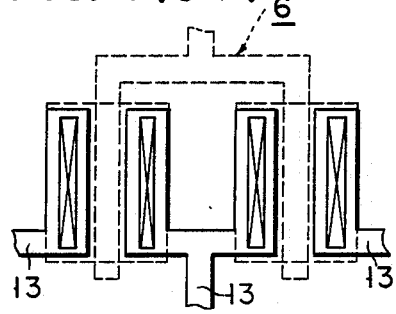 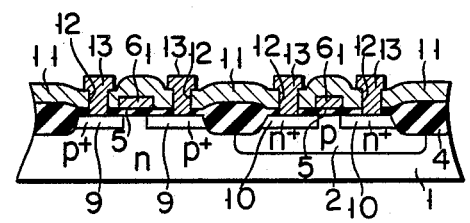
FIG. 2(A₁)  FIG. 2(A₂)
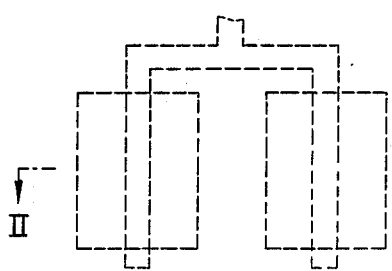 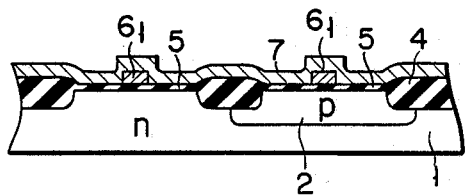
FIG. 2(B₁)  FIG. 2(B₂)
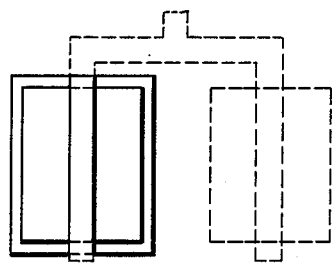 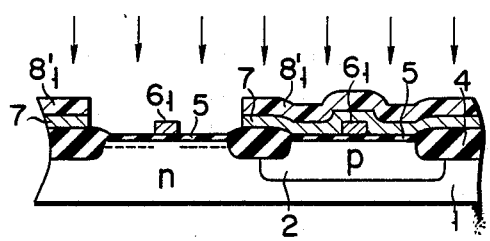

FIG. 2(C1)
FIG. 2(C2)
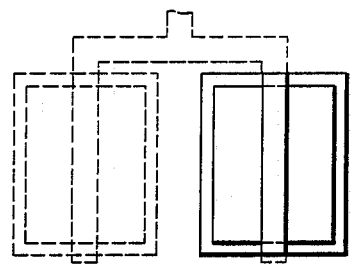
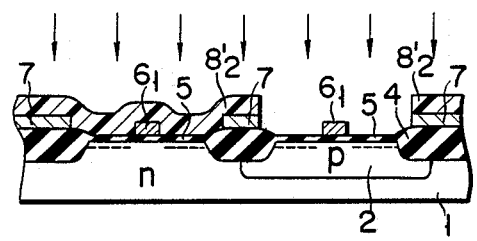
FIG. 2(D1)
FIG. 2(D2)
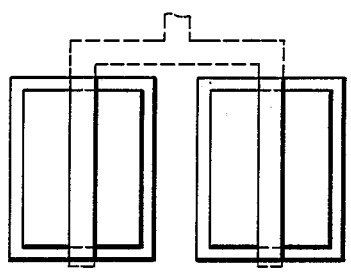
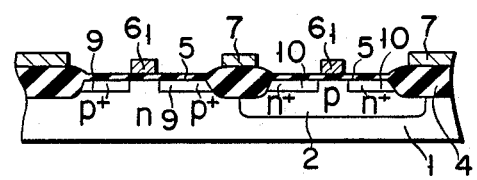
FIG. 3(A)
FIG. 3(B)
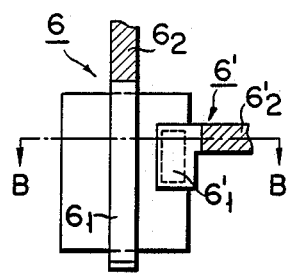
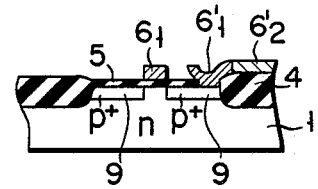

SEMICONDUCTOR DEVICE WITH COMPOSITE ELECTRODE

This application is a continuation, of application Ser. No. 06/778,777, filed Sept. 24, 1985, now abandoned which is a continuation of Ser. No. 390,030, filed June 18, 1982, now abandoned.

BACKGROUND OF THE INVENTION

The present invention relates to a semiconductor device having a wiring layer consisting of a metal compound of a semiconductor material such as silicon, and to a method for manufacturing the same.

Silicon has a melting point which is as high as 1,400° C. and therefore has a significantly high resistance to heat treatment under high temperatures as compared with aluminum which is conventionally used for electrodes or wiring materials. In a field effect transistor using silicon as the gate electrode material, the source and drain regions may be formed using the gate electrode as a mask. Therefore, the channel region is formed in self alignment with the gate electrode, so that the parasitic capacitance due to the superposition of the gate electrode with the source and drain regions may be reduced to the minimum. For this reason, silicon is considered to be a gate electrode material suitable for a field effect transistor which is required to operate at a high speed. However, a silicon layer, particularly, a polycrystalline silicon layer generally used for a gate electrode has a high resistance. For example, an n-type polycrystalline silicon layer of 3,000 Å thickness has a sheet resistance of about 20 $\Omega/\square$. If the extending part of such a gate electrode is used as wiring, delay in signal transmission due to this high resistance impairs high speed operation of the device.

In view of this, it has been recently proposed to use silicides of metals such as Mo, Pt, and Ta for the gate electrode material in place of silicon. The layers of these metal silicides have resistances which are about 1/10 that of the polycrystalline silicon layer as described above. These metal silicides are also stable against heat treatment at high temperatures. Therefore, if these metal silicides are used for the gate electrodes, similar effects as those obtainable with the polycrystalline silicon layer may be obtained while simultaneously preventing an undesirable increase in the resistance of the gate electrode wiring. Furthermore, since these metal silicides are resistant to acids, they may be rinsed with sulfuric acid, nitric acid, hydrochloric acid or the like. In other words, these metal silicides may be handled in the similar manner as in the case of polycrystalline silicon in the manufacturing steps of the semiconductor device.

However, the metal silicide layers have coefficients of thermal expansion which significantly deviate from that of a semiconductor substrate of silicon or the like. For this reason, many interface levels are established by the residual distortion on the surface of the semiconductor substrate below the gate oxide film after heat treatment. This impairs the characteristics of the device. Furthermore, mobile ions in the gate oxide film below the metal silicide film are hard to getter.

In addition to this, the metal silicides have another problem of hard adhesion with semiconductor layer. For this reason, a good ohmic contact may not be obtained between a wiring of a metal silicide film and an element region formed on a semiconductor substrate. This problem is encountered in bipolar semiconductor devices as well as field effect semiconductor devices as long as a metal silicide is used as a wiring material.

SUMMARY OF THE INVENTION

It is an object of the present invention to provide a semiconductor device which is capable of preventing delay in an operation speed due to an increase in the wiring resistance while not impairing the element characteristics.

It is another object of the present invention to provide a semiconductor device with a wiring layer which is capable of forming a good ohmic contact with an element region.

It is still another object of the present invention to provide a method for manufacturing a semiconductor device as described above with a smaller number of manufacturing steps.

According to an aspect of the present invention, there is provided a semiconductor device comprising a single, continuous wiring layer in which a predetermined portion thereof is made of a semiconductor material while the remaining portion thereof is made of a metal compound of a semiconductor material.

The predetermined portion of the wiring layer preferably comprises a gate electrode of a field effect transistor.

According to another aspect of the present invention, there is also provided a method for manufacturing a semiconductor device, comprising the steps of: forming a continuous wiring pattern of a semiconductor material on a semiconductor substrate through an insulating film; covering said wiring pattern with a metal layer except for a predetermined portion thereof; and annealing to cause reaction between a metal of said metal layer with the semiconductor material of said wiring pattern, thereby converting the remaining portion of said wiring pattern into a metal compound of said semiconductor material.

BRIEF DESCRIPTION OF THE DRAWINGS

FIGS. 1A1 to 1J1 are plan views showing the manufacturing steps of a CMOS semiconductor device according to an embodiment of the present invention, with a p-type well region being omitted;

FIGS. 1A2 to 1J2 are sectional views along the line II—II in FIG. 1A1 corresponding to FIGS. 1A1 to 1J1, respectively;

FIGS. 2A1 to 2D1 are plan views showing the manufacturing steps of a CMOS semiconductor device according to another embodiment of the present invention, with a p-type well region being omitted;

FIGS. 2A2 to 2D2 are sectional views along the line II—II in FIG. 2A2 corresponding to FIGS. 2A1 to 2Ad, respectively;

FIG. 3A is a plan view showing a p-channel element region of a CMOS semiconductor device according to still another embodiment of the present invention; and FIG. 3B is a sectional view along the line B—B of FIG. 3A.

DETAILED DESCRIPTION OF THE PREFERRED EMBODIMENTS

A semiconductor material to constitute a wiring pattern may be silicon according to the present invention. A metal for converting this semiconductor material into a metal silicide may be molybdenum (Mo), tungsten (W), platinum (Pt), tantulum (Ta), or the like.

The present invention will now be described by way of its examples.

EXAMPLE 1

Figure 1:
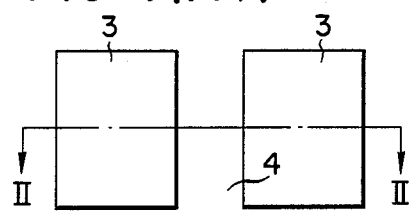
Figure 1:
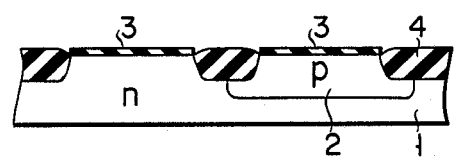
Figure 1:
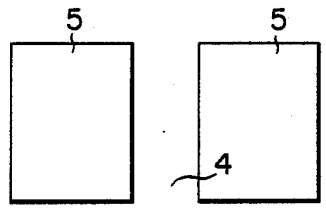
Figure 1:
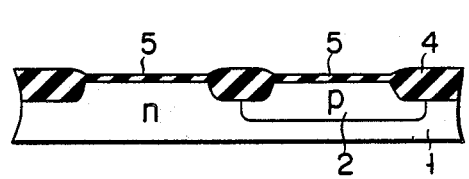
Figure 1:
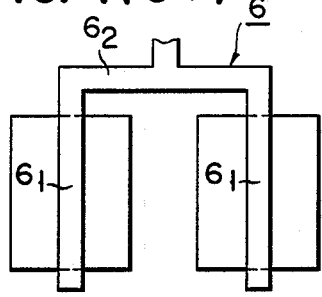
Figure 1:
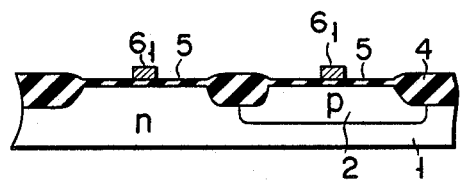
Figure 1:
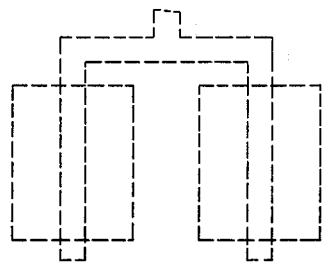
Figure 1:
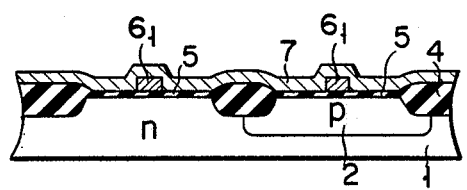

In this example, the present invention is applied to a complementary MOS (to be referred to as CMOS hereinafter) semiconductor device. A method for manufacturing this CMOS semiconductor device will now be described with reference to FIGS. 1A1 to 1J1 and FIGS. 1A2 to 1J2. FIGS. 1A1 to 1J1 are plan views with the p-type well region being omitted, while FIGS. 1A2 to 1J2 are sectional views along the line II—II of FIG. 1A1.

(i) Selective diffusion of boron is performed to form a p-type well region 2 in an n-type silicon substrate 1. Silicon nitride film patterns 3 to cover the prospective element regions are formed by the Chemical Vapor Deposition (to be referred to as CVD) method. Selective oxidation is performed using the silicon nitride film patterns 3 as a mask to form a thick field film 4 which isolates the prospective element regions (FIGS. 1A1 and 1A2).

It is preferable to perform selective oxidation while interposing a silicon oxide film as a buffer between the silicon nitride film patterns 3 and the silicon substrate 1.

(ii) After removing the silicon nitride film patterns 3, the surfaces of the prospective element regions are thermally oxidized in a dry oxygen atmosphere to grow gate oxide films 5 to a thickness of 500 Å (FIGS. 1B1 and 1B2).

Channel doping for controlling the threshold voltages is performed as needed into the n-channel element region and into the p-channel element region, respectively.

(iii) After depositing polycrystalline silicon to a thickness of 3,000 Å on the entire surface of the structure by the CVD method, the polycrystalline silicon layer is patterned to form a wiring pattern 6 including gate electrodes $6_1$ and an extending portion $6_2$ (FIGS. 1C1 and 1C2).

It is also possible to form a wiring pattern separate from the gate electrodes $6_1$ simultaneously as the formation of the wiring pattern 6.

(iv) A molybdenum film 7, of 3,000 Å is then deposited over the entire surface of the structure by sputtering (FIGS. 1D1 and 1D2).

The molybdenum film 7 may be formed by vacuum deposition or the like instead of sputtering.

(v) The molybdenum film 7 is selectively etched by photolithography to expose the n-channel element region, the p-channel element region, and parts of the field oxide film 4 surrounding these elements. A molybdenum film 7' remains on the remaining surface portion (FIGS. 1E1 and 1E2).

(vi) After forming a resist pattern $8_1$ which covers only the n-channel element region, ion implantation of boron is performed using the resist pattern $8_1$ and the gate electrode $6_1$ on the p-channel element region as a mask under the conditions of 120 keV acceleration voltage and $1 \times 10^{16}/cm^2$ dose (FIGS. 1F1 and 1F2).

Since most of the surface of the substrate is covered with the molybdenum film 7', the following effects are obtained. If ion implantation of a large quantity of an impurity as described above is to be performed within a short period of time with the absence of the molybdenum film 7', charge is stored in the wiring pattern 6 of polycrystalline silicon formed on the insulating films such as the gate oxide films 5 and the field oxide films 4 by ion implantation. Then, the reliability of the device is significantly impaired by discharge or electrostatic breakdown such as the gate breakdown. Moreover, charge is also stored in the gate oxide films 5, which also degrades the reliability of the device. Charge is more stored in the gate oxide films 5 than in the wiring pattern 6. On the contrary, if the most of the surfaces of the wiring pattern 6 and the substrate is covered with the molybdenum film 7', charge supplied to the wiring pattern 6 by ion implantation is discharged fast through the molybdenum film 7' and is not stored, preventing the problems as described above. The effects obtainable with the molybdenum film 7' are more significant for the case of an SOS structure in which a silicon layer is epitaxially grown on a sapphire substrate.

(vii) After removing the resist pattern $8_1$, a resist pattern $8_2$ covering only the p-channel element region is formed. Using the resist pattern $8_2$ and the gate electrode $6_1$ on the n-channel element region as a mask, arsenic is ion-implanted at an acceleration voltage of 100 keV and a dose of $1 \times 10^{16}/cm^2$ (FIGS. 1G1 and 1G2).

As in the case of step (v) described above, storage of charge on the wiring pattern 6 is prevented by the molybdenum film 7'.

(viii) After removing the resist pattern $8_2$, annealing is performed at 1,000° C. for 30 minutes to activate the impurity ion-implanted in the element regions and the gate electrodes $6_1$. Then, $p^+$-type source and drain regions 9 are formed in the p-channel element region, while the gate electrode $6_1$ on the p-channel element region is rendered p-conductivity type. Meanwhile, $n^+$-type source and drain regions 10 are formed in the n-channel element region, and the gate electrode $6_1$ is rendered n-conductivity type (FIGS. 1H1 and 1H2).

Upon annealing, silicon reacts with molybdenum and is converted to molybdenum silicide ($MoSi_2$) at the portion of the wiring pattern 6 which is covered with the molybdenum film 7'.

Although this annealing may be performed in a nitrogen atmosphere, it is preferably performed in a vacuum or an inert gas under a reduced pressure.

(ix) The structure is rinsed with dilute sulfuric acid to remove the unreacted molybdenum film 7' (FIGS. 1I1 and 1I2).

As may be seen from the drawings, polycrystalline silicon of the gate electrodes $6_1$ remains unconverted, while that of the extending portion $6_2$ of the wiring pattern 6 is converted to molybdenum silicide ($MoSi_2$). Therefore, the p-type gate electrode $6_1$ and the n-type gate electrode $6_1$ are connected through the extending portion which is converted to molybdenum silicide. Therefore, a p-n junction may not be formed at the wiring pattern 6, so that voltage drop due to the presence of the p-n junction or delay in the operation speed due to the parasitic capacitance may be prevented.

(x) An insulating film 11 of silicon oxide is deposited by the CVD method. After forming contact holes 12, metal wirings 13 of aluminum or the like are formed (FIGS. 1J1 and 1J2).

In a semiconductor device of CMOS structure obtained in this manner, the source and drain regions are formed by self alignment, so the packaging density of the elements is improved. Furthermore, since the wiring pattern 6 is made of molybdenum silicide except for the gate electrodes $6_1$, a delay in the operation speed of the device due to an increase in the wiring resistance may be prevented. The gate electrodes $6_1$ are still made of polycrystalline silicon, so degradation in the element characteristics may be prevented. According to the method of the present invention, after forming the wiring pattern 6 of polycrystalline silicon, parts of the wiring pattern 6 except for the gate electrodes $6_1$ are converted to molybdenum silicide. Accordingly, adhesion between the gate electrodes $6_1$ of polycrystalline silicon with the extending portion $6_2$ of molybdenum silicide is not impaired. If the wiring pattern 6 is entirely made of polycrystalline silicon, a p-n junction is formed in the wiring pattern 6. In order to avoid it, it is necessary to separate the p- and n-type regions from each other and to connect these regions with a second wiring layer. However, in the example described above, such a wiring layer and an area to accommodate it are necessary, and micronization of the device is facilitated. At the same time, factors for reducing the reliability of the device such as defective connection of the wiring may be eliminated.

In the example described above, annealing to convert the wiring pattern 6 except for the gate electrodes $6_1$ to molybdenum silicide is performed simultaneously with annealing to activate the impurity which is ion-implanted. However, the former annealing may be performed prior to ion implantation or in the state shown in FIGS. 1E1 and 1E2. In this case, the annealing conditions after ion implantation may be moderated since only activation of the impurity need be performed. Then, shortening of the channel length due to redistribution of the impurity may be prevented. It is also possible to perform annealing for conversion into molybdenum silicide between two ion implantation steps, that is, in the state shown in FIGS. 1F1 and 1F2, and to utilize this annealing to control the impurity diffusion length of the p- or n-channel element. In this case, boron ions implanted into the p-channel element region prior to annealing for conversion into molybdenum silicide are redistributed once by this annealing and then by annealing for activation of arsenic ion-implanted into the n-channel element region. For this reason, the redistribution conditions for the impurities in the n- and p-channel element regions may be varied as needed.

EXAMPLE 2

This example presents a simplified method of the method in Example 1. This example will be described with rereference to FIGS. 2A1 to 2D1 which are plan views with the p-type well region being omitted, and to FIGS. 2A2 to 2D2 which are sectional views along the line II—II in FIG. 2A1.

(i) Steps (i) to (iv) in Example 1 are performed in a similar manner (FIGS. 2A1 and 2A2).

(ii) After forming a resist pattern $8_1'$ having an opening corresponding to the p-channel element region and its surrounding part, the molybdenum film 7 is selectively etched, using the resist pattern $8_1'$ as a mask, to expose the parts of the field oxide film 4 corresponding to the p-channel element region and its surrounding part. Then, using the resist pattern $8_1'$ and the exposed gate electrode $6_1$ as a mask, ion implantation of boron is performed under the same conditions as in Example 1 (FIGS. 2B1 and 2B2).

(iii) After removing the resist pattern $8_1$, another resist pattern $8_2'$ having an opening corresponding to the n-channel element region and its surrounding part is formed. Using the resist pattern $8_2'$ as a mask, the molybdenum film 7 is selectively etched to expose the n-channel element region and its surrounding part. Subsequently, arsenic is ion implanted under the same conditions as in Example 1 (FIGS. 2C1 and 2C2).

(iv) After removing the resist pattern $8_2'$, annealing is performed under the same conditions as in Example 1. Upon this annealing treatment, the ion-implanted impurities are activated while the part of the wiring pattern 6 of polycrystalline silicon other than the gate electrodes $6_1$ is converted into molybdenum silicide (FIGS. 2D1 and 2D2).

(v) Steps (ix) and (x) in Example 1 are performed to complete a semiconductor device having a CMOS structure as shown in FIGS. 1I1 and 1I2.

In this example, the resist patterns $8_1'$ and $8_2'$ for etching the molybdenum film 7 are also used as a mask for ion implantation. For this reason, the number of steps for forming the resist patterns is decreased by one as compared to the method of Example 1.

In this example. annealing for converting part of the wiring pattern 6 to molybdenum silicide is performed simultaneously with annealing for activating the ion-implanted impurities. However, as has been described with reference to Example 1, the former annealing may be performed in the state as shown in FIGS. 2A1 and 2A2 or in FIGS. 2B1 and 2B2. However, if annealing for conversion into molybdenum silicide is performed in the state shown in FIGS. 2B1 and 2B2, the gate electrode $6_1$ on the n-channel element region is also converted into molybdenum silicide, and the n-channel element will use the gate electrode of molybdenum silicide. In this case, in the n-channel element having the gate electrode $6_1$ of molybdenum silicide, the threshold voltage increases by about 0.5 V as compared to an n-channel element in which the gate electrode $6_1$ comprises an n-type polycrystalline silicon layer. If the order of ion implantation steps is reversed, only the gate electrode of the p-channel element may be made of molybdenum silicide. By partially utilizing this method, part of the p- or n-channel element may be selected and the gate electrode may be converted into molybdenum silicide, so that semiconductor devices including elements with various threshold voltages may be manufactured.

EXAMPLE 3

FIG. 3A is a plan view of a p-channel element region of a CMOS semiconductor device according to still another embodiment of the present invention, while FIG. 3B is a sectional view along the line B—B in FIG. 3A. The same reference numerals in FIGS. 3A and 3B denote the same parts as in Examples 1 and 2.

In this example, a wiring pattern 6' which is in direct contact with the p+-type source region 9 or drain region 9 of the p-channel element is formed, in addition to the wiring pattern 6 including the gate electrodes $6_1$ and the extending part $6_2$. A direct contact part $6_1'$ of the wiring pattern 6' is made of polycrystalline silicon, while a remaining portion $6_2'$ is made of molybdenum silicide. The wiring pattern 6' may be formed by the similar method for forming the wiring pattern 6 in Examples 1 and 2. It is also possible to form a similar wiring pattern 6' in the n-channel element region.

In the semiconductor device in Example 3, most of the wiring pattern 6' is made cf molybdenum silicide and the wiring pattern 6' has a small resistance, so the operation speed of the device may not be delayed. Since the direct contact portion $6_1'$ is made of polycrystalline silicon, it forms a good ohmic contact with the p+-type source region 9 or drain region 9. It is possible to form a polycrystalline silicon wiring as the second wiring layer on the wiring pattern 6' through an interlayer insulating film and to establish a good ohmic contact between the second wiring layer and the wiring pattern 6'. In this case, the material of the direct contact portion $6_1'$ of the wiring pattern 6' can be left unconverted to provide a good ohmic contact between the two wiring layers.

Examples 1 to 3 have been described with reference to CMOS semiconductor devices. However, it is to be noted that the present invention may be similarly applied to p- and n-channel MOS semiconductor devices.

The present invention is also applicable to semiconductor devices in which elements are formed on a semiconductor layer on an insulating substrate of a material such as a sapphire and spinel as well as to semiconductor devices which use bulk semiconductor substrates. In this case, outstanding effects may be obtained as has been described above.

The present invention can also be applied to various other kinds of semiconductor devices such as bipolar semiconductor devices as well as to field effect semiconductor devices as long as these devices have wiring layers which form ohmic contacts with element regions.

In summary, the present invention provides a semiconductor device which has a wiring layer which, in turn, has advantages of both a semiconductor material and a metal compound, and also provides a method for manufacturing the same.

What we claim is:

1. A semiconductor device comprising:
a field effect transistor having a source, a drain, and a channel region of a first semiconductor material; and
a single continuous wiring layer extending in a wiring layer plane, said wiring layer comprising an electrode portion made of a second semiconductor material coupled to said channel region to form a gate electrode, and an interconnection portion made of a metal compound of said second semiconductor material adapted for connection to associated circuitry, said wiring layer having, at all positions, a substantially homogeneous composition in a direction perpendicular to said wiring layer plane.

2. A semiconductor device comprising a plurality of field effect transistors, each having a source, a drain, and a channel region of semiconductor material; and
a single continuous wiring layer extending in a wiring layer plane, said wiring layer comprising an electrode portion made of a semiconductor material coupled to at least one of said channel regions to form at least one gate electrode, and an interconnection portion made of a metal compound of the semiconductor material adapted for connection to associated circuitry, said wiring layer having, at all positions, a substantially homogeneous composition in a direction perpendicular to said wiring layer plane.

3. A semiconductor device comprising a source, a drain, and a channel region of a first semiconductor material; and
a single continuous wiring layer extending in a wiring layer plane, said wiring layer comprising an electrode portion made of a second semiconductor material directly coupled to at least one of said source and drain, and an interconnection portion made of a metal compound of said second semiconductor material adapted for connection to associated circuitry, said wiring layer having, at all positions, a substantially homogeneous composition in a direction perpendicular to said wiring layer plane.

4. A semiconductor device according to claim 3, wherein said electrode portion forms an ohmic contact with at least one of said source and drain.

5. A semiconductor device as recited in claim 1, wherein said plurality of field effect transistors comprises complementary MOS transistors.

6. A semiconductor device according to claims 1, 2, or 3, wherein said semiconductor material of said electrode portion is polycrystalline silicon.

7. A semiconductor device according to claim 1, wherein a metal of said metal compound is one member selected from the group consisting of molybdenum, tungsten, platinum and tantalum.

* * * * *